United States Patent
Kim

(10) Patent No.: US 11,611,336 B2
(45) Date of Patent: Mar. 21, 2023

(54) COMPARATOR FOR LOW-BANDING NOISE AND CMOS IMAGE SENSOR INCLUDING THE SAME

(71) Applicant: SK hynix Inc., Icheon-si (KR)

(72) Inventor: Hyeon-June Kim, Yeosu-si (KR)

(73) Assignee: SK hynix Inc., Icheon-si (KR)

( * ) Notice: Subject to any disclaimer, the term of this patent is extended or adjusted under 35 U.S.C. 154(b) by 301 days.

(21) Appl. No.: 16/683,100

(22) Filed: Nov. 13, 2019

(65) Prior Publication Data
US 2020/0162067 A1   May 21, 2020

(30) Foreign Application Priority Data
Nov. 15, 2018 (KR) .................. 10-2018-0140763

(51) Int. Cl.
*H04N 5/378* (2011.01)
*H03K 5/24* (2006.01)
*G11C 27/02* (2006.01)

(52) U.S. Cl.
CPC .......... *H03K 5/2481* (2013.01); *G11C 27/02* (2013.01); *H04N 5/378* (2013.01)

(58) Field of Classification Search
CPC .... H03K 5/2481; G11C 27/02; G11C 27/026; H04N 5/378; H04N 5/3658; H04N 5/341; H04N 5/374; H04N 5/37455; H04N 5/3575; H04N 5/3741
See application file for complete search history.

(56) References Cited

U.S. PATENT DOCUMENTS

| | | | |
|---|---|---|---|
| 5,329,252 A | 7/1994 | Major | |
| 2016/0336931 A1 | 11/2016 | Hummerston et al. | |
| 2017/0272678 A1* | 9/2017 | Sakakibara | H04N 5/37455 |
| 2022/0094871 A1* | 3/2022 | Tomita | H04N 5/37455 |

FOREIGN PATENT DOCUMENTS

| | | |
|---|---|---|
| CN | 1391719 A | 1/2003 |
| CN | 103944545 A | 7/2014 |
| CN | 108428462 A | 8/2018 |
| CN | 108347247 B | 8/2021 |
| JP | 2003348376 A | 12/2003 |
| KR | 20140033604 A | 3/2014 |
| KR | 10-1507199 | 3/2015 |
| KR | 10-1569953 | 11/2015 |
| KR | 20180047710 A | 5/2018 |

OTHER PUBLICATIONS

Xueyuan, W. et al., "Design of the Slope Compensation for a High-speed Broadband Boost Converter." 1994-2022 China Academic Journal Electronic Publishing House. 7 pages.

* cited by examiner

*Primary Examiner* — Twyler L Haskins
*Assistant Examiner* — Angel L Garces-Rivera
(74) *Attorney, Agent, or Firm* — Perkins Coie LLP

(57) ABSTRACT

A comparator may include: a comparison block suitable for comparing a ramp signal and a pixel signal, and outputting a comparison signal; a voltage adjusting block suitable for adjusting a clamping voltage; and an output voltage swing control block suitable for controlling an output voltage swing of the comparison block according to the clamping voltage from the voltage adjusting block.

18 Claims, 9 Drawing Sheets

COMPARATOR FOR LOW-BANDING NOISE AND CMOS IMAGE SENSOR INCLUDING THE SAME

CROSS-REFERENCE TO RELATED APPLICATION

This patent document claims the priority and benefits of Korean Patent Application No. 10-2018-0140763 filed on Nov. 15, 2018, which is incorporated herein by reference in its entirety.

TECHNICAL FIELD

The technology and implementations disclosed in this patent document relate to analog-to-digital converters (ADCs) and image sensors including ADCs.

BACKGROUND

Image sensors such as a charge coupled device (CCD) or a CMOS image sensor (CIS) include a large number of image sensor pixels to convert light photons into electrons. Each of the pixels accumulates an electric charge that is proportional to the number of photons captured by the sensor pixel.

In the majority of image sensors, analog-to-digital converters (ADCs) are employed to produce digital outputs based on analog pixel outputs corresponding to the electric charge accumulated by the sensor pixels. The analog-to-digital conversion of the analog pixel outputs is a very important process that affects the performance of the image sensors, and thus different approaches can be employed in given circumstances.

SUMMARY

The embodiments of this patent document relate to image sensing devices with improved performance characteristics. In some embodiments, the disclosed image sensing devices include a comparator for limiting an output voltage swing thereof using an output voltage swing control block and a CIS including the same.

In an embodiment of the disclosed technology, a comparator may include: a comparison circuit configured to compare a ramp signal with a pixel signal and output a comparison signal; a voltage adjusting circuit configured to adjust a clamping voltage; and an output voltage swing control circuit coupled to the comparison circuit and the voltage adjusting circuit to control an output voltage swing of the comparison circuit based on the clamping voltage from the voltage adjusting circuit.

The comparator may further include a sampling circuit coupled to the voltage adjusting circuit to sample the clamping voltage from the voltage adjusting circuit, and transfer the sampled voltage to the output voltage swing control circuit.

In another embodiment of the disclosed technology, a comparator may include: an output node coupled to one or more pull up transistors configured to pass a positive supply voltage to an output terminal thereof and one or more pull down transistors configured to pass a negative supply voltage to the output terminal thereof; a clamp control circuit configured to generate a first control voltage upon a detection that a voltage of the output node rises above a first threshold level and generate a second control voltage upon a detection that the voltage of the output node drops below a second threshold level, wherein the first voltage is lower than the positive supply voltage and the second voltage is higher than the negative supply voltage; and a clamp circuit coupled to the output node to maintain a voltage value of the output node within a voltage range between the first threshold voltage and the second threshold voltage based on the first and second control voltages. In another embodiment of the disclosed technology, a comparator may include: at least two input nodes; at least one output node; one or more pull up transistors coupled to the at least one output node configured to receive a positive supply voltage to increase an output node of the comparator towards the positive supply voltage; one or more pull down transistors coupled to the at least one output node configured to receive a negative supply voltage to decrease the output node of the comparator towards the negative supply voltage; a clamp control circuit to generate a first control voltage upon a detection that a voltage of the output node rises above a first threshold level and generate a second control voltage upon a detection that the voltage of the output node drops below a second threshold level; a first clamp circuit including a first control terminal to receive the first control voltage and coupled to the output node to provide a first current path to the output node based on the first control voltage to clamp a voltage value of the output node; and a second clamp circuit including a second control terminal to receive the second control voltage and coupled to the output node to provide a second current path to the output node based on the second control voltage to clamp the voltage value of the output node.

In another embodiment of the disclosed technology, an image sensor may include a pixel array including a plurality of imaging pixels arranged in rows and columns to generate pixel signals responsive to incident light, a ramp signal generator to generate a ramp signal, and a comparator coupled to the pixel array and the ramp signal to compare the pixel signals with the ramp signal. The comparator includes an output node coupled to one or more pull up transistors configured to receive a positive supply voltage and one or more pull down transistors configured to receive a negative supply voltage, voltage upon a detection that a voltage of the output node rises above a first threshold level and generate a second control voltage upon a detection that the voltage of the output node drops below a second threshold level, wherein the first voltage is lower than the positive supply voltage and the second voltage is higher than the negative supply voltage, and a clamp circuit coupled to the output node to clamp a voltage value of the output node within a voltage range between the first threshold voltage and the second threshold voltage based on the first and second control voltages.

In another embodiment of the disclosed technology, a CIS may include a pixel array suitable for outputting pixel signals corresponding to incident light; a row decoder suitable for selecting and controlling a pixel within the pixel array for each row line; a ramp signal generator suitable for generating a ramp signal; a comparison block suitable for comparing the ramp signal applied from the ramp signal generator to the pixel signals from the pixel array; a voltage adjusting block suitable for adjusting a clamping voltage; an output voltage swing control block suitable for controlling an output voltage swing of the comparison block according to the clamping voltage from the voltage adjusting block; a counting circuit suitable for counting a clock according to output signals from the comparison block; a memory circuit suitable for storing counting information from the counting circuit; a control circuit suitable for controlling the operations of the row decoder, the ramp signal generator, the comparison block, the counting circuit and the memory circuit; and a column readout circuit suitable for outputting data of the memory circuit under control of the control circuit.

The CIS may further include a sampling block suitable for sampling the clamping voltage from the voltage adjusting block, and transferring the sampled voltage to the output voltage swing control block.

DETAILED DESCRIPTION

Figure 1A:
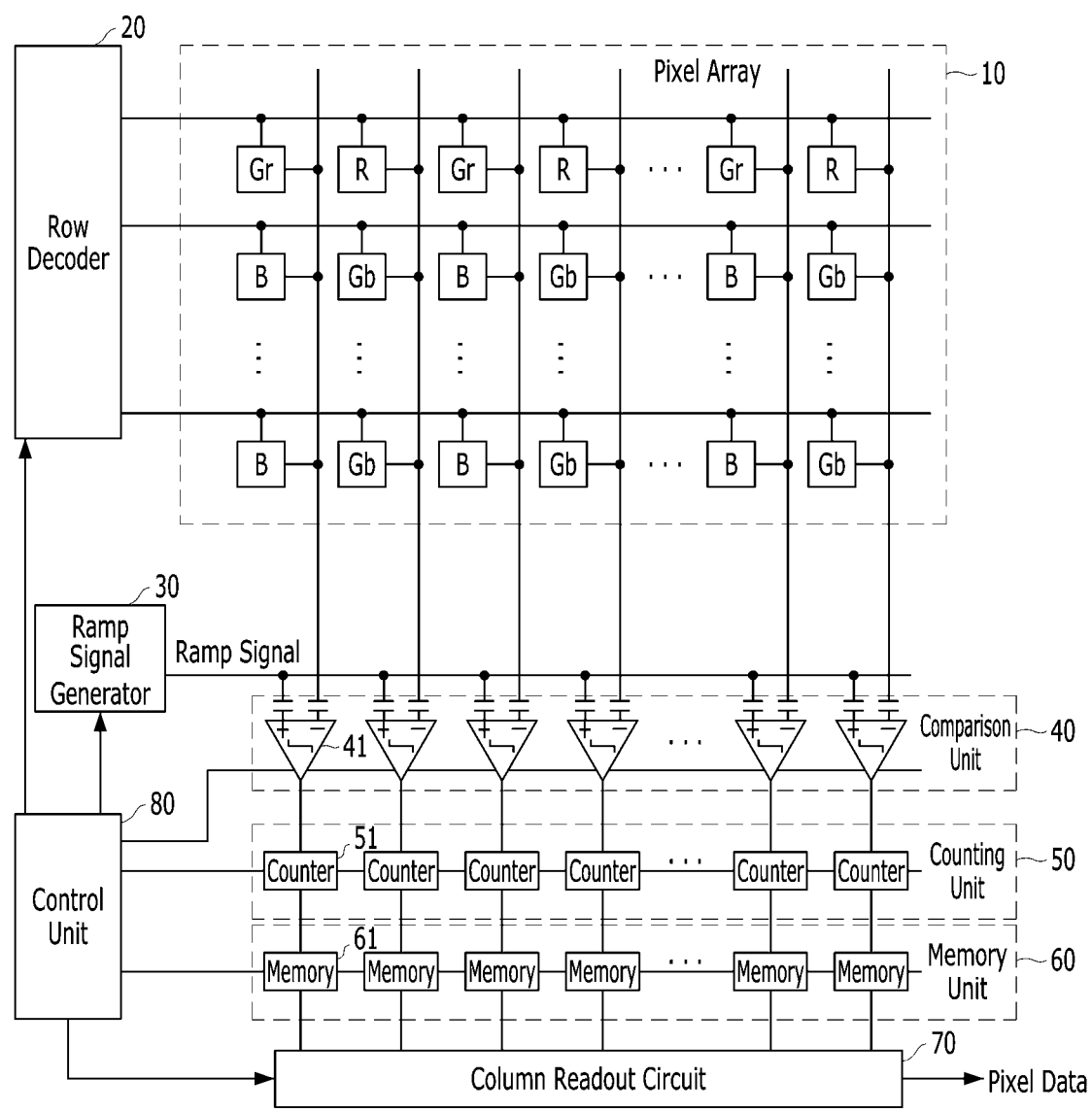
FIG. 1A illustrates an example of a CMOS image sensor (CIS).

Image sensors such as CIS may include analog-to-digital converters (ADCs) to produce digital outputs based on analog pixel outputs corresponding to the electric charge accumulated by image sensor pixels of the image sensors. A traditional approach was to use a single ADC per image sensor such that the pixel outputs are time multiplexed to the input of a global ADC to produce the digital outputs. With the increasing demand for high resolution and high frame rates, such a traditional approach has become impractical, and thus a column parallel ADC, which is implemented by placing one ADC per pixel array column, has emerged as an alternative to the traditional approach. Even in this column parallel ADC, however, each ramp generator is connected to tens to thousands of comparators to apply ramp signals to the comparators. Since the overall load seen by the global ramp generator includes all the parasitic capacitances and resistances associated with the comparators, changes in capacitances and resistances of some comparators may impact the range of current and/or voltage conditions to which other comparators are subjected, resulting in an inaccuracy of the analog-to-digital conversion.

The ADC can use a single slope ramp signal as a reference signal for sampling the analog pixel outputs. The ramp signal and the analog pixel outputs are applied to a comparator while a counter is counting. Once the voltage of the ramp signal is equal to the voltage of the analog pixel outputs, the counter value is stored to produce the digital outputs. In some implementations of the ADC, a lot of comparators are coupled to a global ramp generator in common to receive the ramp signals.

In an embodiment, the comparator may be implemented using an operational transconductance amplifier (OTA) whose differential input voltages produce an output current. The output voltage of the OTA may be determined based on its load resistance. For example, the amplifier's output voltage is the product of its output current and its load resistance. In another embodiment, the comparator may be implemented using one or more inverters (e.g., cascaded CMOS inverters).

In some implementations, the comparator may include input nodes that include transistors to receive the ramp signal and the analog pixel output and output nodes that include transistors to "pull up" or "pull down" the output node to a positive supply voltage (e.g., Vdd voltage) or to a negative supply voltage (e.g., ground voltage). When the voltage at the output node fluctuates between the positive supply voltage and the negative supply voltage, the "kickback" effect can cause the parasitic capacitance of the input nodes seen by the global ramp generator to change. Changes in the load capacitance at the input nodes of the thousands of comparators can induce non-linearity in the ADC operation.

As discussed above, the CIS converts an analog signal (pixel signal) outputted from a pixel array into a digital signal, unlike a solid state pickup device. In order to convert an analog signal into a digital signal, the CIS uses a high-resolution analog-to-digital converter (ADC).

Examples of the ADC may include a single ADC scheme using a single ADC and a column ADC scheme using column ADCs, depending on how to implement the ADCs.

The single ADC scheme converts analog signals outputted from all columns of a pixel array into digital signals within a predetermined time, using one ADC which is operated at high speed. The single ADC scheme can reduce the chip area of the CIS, but has high power consumption because the ADC needs to be operated at high speed.

In the column ADC scheme, however, ADCs with a simple structure (e.g., single-slope ADCs) are arranged at the respective columns to implement the CIS. The column ADC scheme increases the chip area of the CIS, but has small power consumption because each of the ADCs may operate at a lower speed as compared to the single ADC.

The column ADC scheme performs correlated double sampling (CDS) on an analog output voltage which is an output signal of the pixel array, stores resultant voltages, compares the voltages stored during the CDS operation to a predetermined ramp signal generated by a ramp signal generator, and provides a comparison signal for generating a digital code.

The single-slope ADC may use an operational transconductance amplifier (OPA) using a plurality of transistors (e.g., five or more transistors) or an inverter-type comparator using two or more transistors. In some implementations, each single-slope ADC may use a plurality of cascaded comparators (e.g., three cascaded comparators).

A comparator at a first stage receives a ramp signal through one of two input transistors thereof and receives a pixel signal through the other input transistor. In the input transistors of the comparator, changes in operation regions of the transistors may result in changes in capacitances of a gate-source parasitic capacitor Cgs and a drain-source parasitic capacitor Cds.

The input terminals (parasitic capacitance=Cgs+Cds) of the comparators of several tens to thousands of single-slope ADCs are seen by the ramp signal generator as loads. In an implementation, the ramp signal generator decreases (or increases) ramp signal voltages during its operation.

During the operation, the gate voltage of an input transistor configured to receive a ramp signal may increase or decrease as the ramp signal voltage decreases (or increases). When the gate voltage (ramp signal) becomes equal to the gate voltage (pixel signal) of another input transistor configured to receive a pixel signal, the comparator outputs a comparison signal. A counter counts a number of clock pulses until the ramp signal becomes equal to the pixel signal, and a memory stores an output value of the counter.

Even after the comparator outputs the comparison signal, however, the ramp signal keeps increasing or decreasing until the ramp signal reaches a preset value. Therefore, the gate voltage of the input transistor configured to receive the ramp signal continuously decreases (or increases).

Therefore, as the voltage of an output node of the input transistor configured to receive the pixel signal also continuously decreases (or increases), the operation region of the input transistor configured to receive the pixel signal is changed from a saturation region to a triode region or linear region. In other words, the input transistor configured to receive the pixel signal may be seen by the ramp signal generator as a resistor, due to a decrease in the drain-source voltage Vds of the input transistor configured to receive the pixel signal.

For this reason, a common voltage Vcm of the input transistor configured to receive the ramp signal and the input transistor configured to receive the pixel signal is significantly changed, which results in a significant change in the parasitic capacitance Cgs between the gate and source of the input transistor configured to receive the ramp signal.

Changes in the operating regions of the transistors in the comparators lead to changes in the load of the ramp signal generator. When the ADC is used in the CIS, changes in the load of the ramp signal generator can result in a banding noise. Furthermore, existing operation points are all changed to affect the performance of the CDS operation.

In reducing such a banding noise, additional buffers can reduce the banding noise by isolating the output terminal of the ramp signal generator from the input terminals of the respective comparators, and by inputting the ramp signal to the respective comparators through the buffers.

However, when the buffers are added to reduce banding noise, additional areas will be required for the additional buffers and the power consumption may be increased by use of the buffers, and an input voltage swing may be reduced by gain errors of the buffers.

Figure 1B:
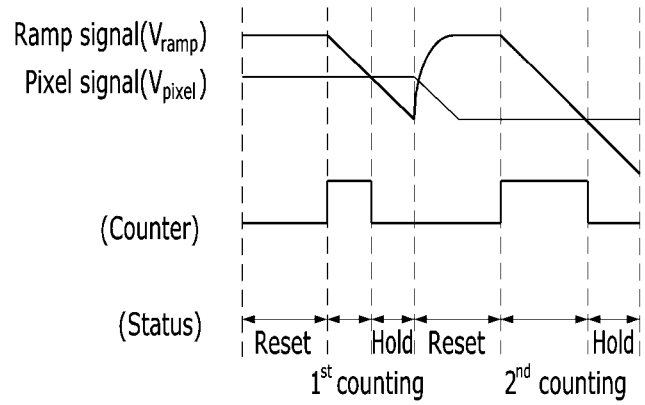
FIG. 1B is an example of an analog-digital conversion timing diagram of the CIS of FIG. 1A.

FIG. 1A illustrates an example of a complementary metal oxide semiconductor (CMOS) image sensor (CIS) that employs a column parallel analog-to-digital converter (ADC) that receives ramp signals from a ramp signal generator such as a single slope ramp generator. FIG. 1B is an example of an analog-digital conversion timing diagram of the CIS of FIG. 1A.

As illustrated in FIG. 1A, the CIS implemented based on some embodiments of the disclosed technology may include a pixel array 10, a row decoder 20, a ramp signal generator 30, a comparison circuit 40, a counting circuit 50, a memory circuit 60, a control circuit 80 and a column readout circuit 70. The pixel array 10 may output pixel signals corresponding to incident light. The row decoder 20 may select a pixel in the pixel array 10 for each row line and control an operation of the selected pixel, under control of the control circuit 80. The ramp signal generator 30 may generate a ramp signal under control of the control circuit 80. The comparison circuit 40 may compare the value of the ramp signal applied from the ramp signal generator 30 to the values of the pixel signals outputted from the pixel array 10, under control of the control circuit 80. The counting circuit 50 may count clock pulses applied from the control circuit 80 according to output signals of the comparison circuit 40. The memory circuit 60 may store a counter output generated by the counting circuit 50 under control of the control circuit 80. The control circuit 80 may control the operations of the row decoder 20, the ramp signal generator 30, the comparison circuit 40, the counting circuit 50, the memory circuit 60 and the column readout circuit 70. The column readout circuit 70 may sequentially output the data of the memory circuit 60 as pixel data PXDATA under control of the control circuit 80.

In order to remove an offset value of each pixel, the CIS may generally compare pixel signals (pixel output voltages) before and after a light signal is incident, and actually measure only a pixel signal generated by the incident light. Such a technique may be referred to as correlated double sampling (CDS). In some implementation, the CDS may be performed by the comparison circuit 40. Correlated double sampling (CDS) of image sensors may be used to reduce the impact of reset sampling noise (e.g., noise generated by a reset transistor). In some implementations, the CDS can take two samples of a signal out of the pixel and subtracting the first from the second to remove reset sampling noise. For example, the CDS can take a sample of a reset voltage value and a sample of a signal voltage value out of the pixel and subtract the reset value from the signal value, removing reset sampling noise.

The comparison circuit 40 may include a plurality of comparators, the counting circuit 50 may include a plurality of counters, and the memory circuit 60 may include a plurality of memories. In some implementation, each column of the pixel array may be coupled to one of the comparators, one of the counters and one of the memories.

Referring to FIGS. 1A and 1B, operations of one of the comparators, one of the counters and one of the memories will be described as an example.

First, a first comparator 41 may receive a pixel signal from a first column of the pixel array 10 through one terminal thereof and receive the ramp signal from the ramp signal generator 30 through the other terminal thereof to compare the values of the two signals according to a control signal from the control circuit 80, and output a comparison signal.

In an implementation, the ramp signal $V_{Ramp}$ has a voltage level that increases or decreases linearly until the voltage level reaches a predetermined magnitude after a reset operation (e.g., single-slope ramp). The ramp signal may be activated synchronously with a first counter 51. While the first comparator 41 is comparing the pixel signal with the ramp signal, the first counter 51 counts until the voltage of the ramp signal $V_{Ramp}$ becomes equal to the voltage of the ramp signal.

In an implementation, the first comparator 41 outputs a comparison signal obtained by comparing the pixel signal with the ramp signal, and the value of the comparison signal outputted from each of the comparators is inverted when the voltage of the ramp signal $V_{Ramp}$ becomes equal to the voltage of the ramp signal.

The first counter 51 may count clock pulses provided from the control circuit 80 until the comparison signal outputted from the comparator 41 is inverted, and output the number of clock pulses counted as a counter output. Each of the counters may be reset according to a reset control signal provided by the control circuit 80.

Then, a first memory 61 may store the counter output generated by the counter 51, and then the counter output is provided to the column readout circuit 70.

In some implementations, the CIS may perform a primary counting on a reset signal (reset voltage) and perform secondary counting on an image signal (signal voltage) as illustrated in FIG. 1B.

Figure 2A:
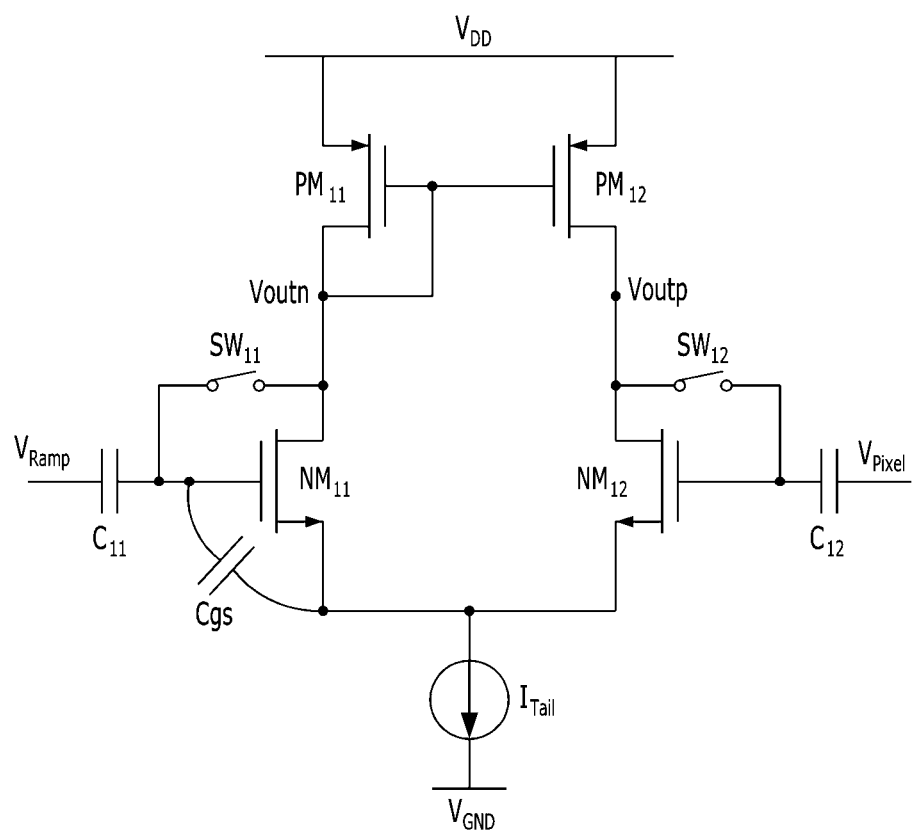
FIG. 2A illustrates an example of a comparator of FIG. 1A.
Figure 2B:
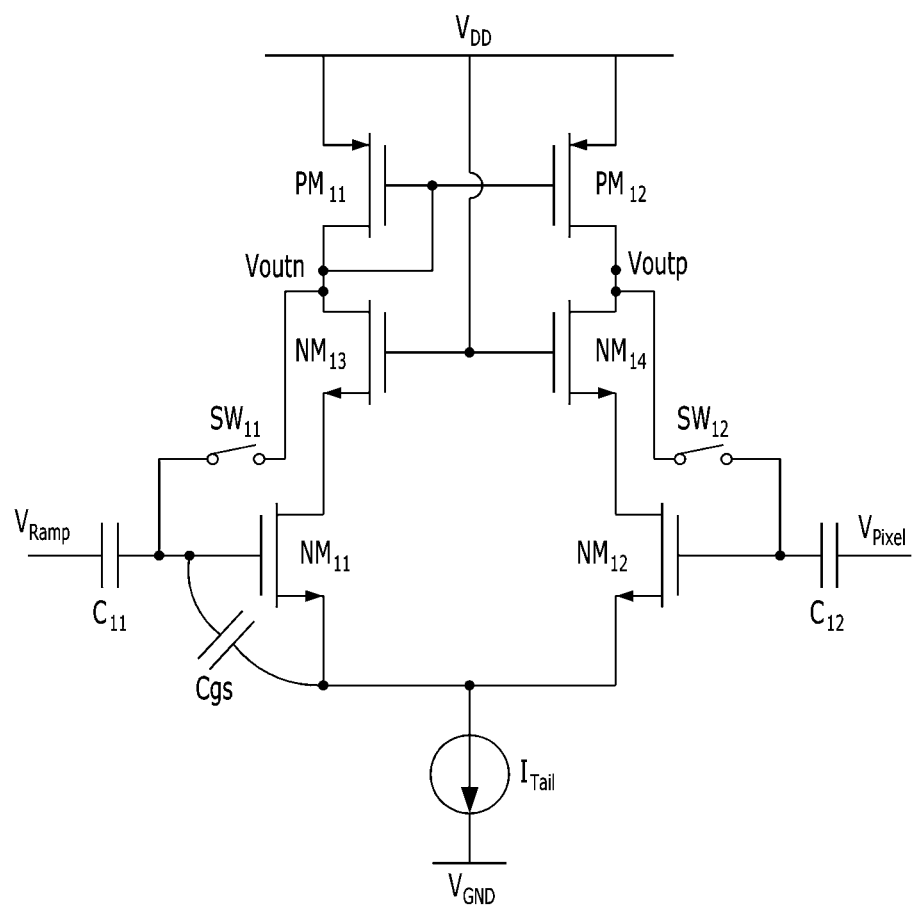
FIG. 2B illustrates another example of the comparator of FIG. 1A.

FIG. 2A illustrates an example of the comparator illustrated in FIG. 1A, and FIG. 2B illustrates another example of the comparator illustrated in FIG. 1A.

As illustrated in FIG. 2A, the comparator may include a PMOS transistor $PM_{11}$, a PMOS transistor $PM_{12}$, a capacitor $C_{11}$, a capacitor $C_{12}$, an NMOS transistor $NM_{11}$, an NMOS transistor $NM_{12}$, a switch $SW_{11}$ and a switch $SW_{12}$. The PMOS transistor $PM_{11}$ may have a diode-connection structure in which a source terminal thereof is coupled to a first supply voltage $V_{DD}$ and gate and drain terminals thereof are coupled to each other. The PMOS transistor $PM_{12}$ may have a source terminal coupled to the first supply voltage $V_{DD}$, a gate terminal coupled to the gate terminal of the PMOS transistor $PM_{11}$, and a drain terminal coupled to a first output node $V_{outp}$. The capacitor $C_{11}$ may have one terminal configured to receive the ramp signal $V_{Ramp}$, i.e. a ramp voltage, and the other terminal coupled to a gate terminal of the NMOS transistor $NM_{11}$. The capacitor $C_{12}$ may have one terminal configured to receive a pixel signal $V_{Pixel}$, i.e. a pixel voltage, and the other terminal coupled to a gate terminal of the NMOS transistor $NM_{12}$. The NMOS transistor $NM_{11}$ may have a drain terminal coupled to the drain terminal of the PMOS transistor $PM_{11}$, i.e. a second output node $V_{outn}$, the gate terminal coupled to the other terminal of the capacitor $C_{11}$, and a source terminal coupled to a second supply voltage $V_{GND}$ through a current source $I_{Tail}$. The NMOS transistor $NM_{12}$ may have a drain terminal coupled to the first output node $V_{outp}$, the gate terminal coupled to the other terminal of the capacitor $C_{12}$, and a source terminal coupled to the second supply voltage $V_{GND}$ through the current source had. The switch $SW_{11}$ may be coupled between the second output node $V_{outn}$ and the gate terminal of the NMOS transistor $NM_{11}$. The switch $SW_{12}$ may be coupled between the first output node $V_{outp}$ and the gate terminal of the NMOS transistor $NM_{12}$.

In order to perform CDS on the pixel signal $V_{Pixel}$, the switches $SW_{11}$ and $SW_{12}$ may be turned on to sample a reset voltage Vreset of the pixel signal (reset voltage+signal voltage).

Thus, the voltage levels of the gate terminals and the drain terminals of the NMOS transistor $NM_{11}$ and the NMOS transistor $NM_{12}$ may become equal to each other, and the drain voltages of the PMOS transistor $PM_{11}$ and the PMOS transistor $PM_{12}$ may become equal to each other.

In the comparator illustrated in FIG. 2A, the common voltage of the ramp signal $V_{Ramp}$ may be sampled in the capacitor $C_{11}$ based on an offset signal which is structurally generated, and the reset voltage of the pixel signal may be sampled in the capacitor $C_{12}$ based on the offset signal.

In this way, the common voltage of the ramp signal and the reset voltage of the pixel signal, inputted to the comparator, may be held in the gate terminals of the NMOS transistors $NM_{11}$ and $NM_{12}$, and a change of the ramp signal or the pixel signal may be sensed in the form of AC-coupling through the capacitors $C_{11}$ and $C_{12}$.

Furthermore, in order to sample the signal voltage Vsignal of the pixel signal (reset voltage+signal voltage), the switches $SW_{11}$ and $SW_{12}$ may be turned off.

At this time, a switching noise signal caused by momentary switching may be stored in the capacitors $C_{11}$ and $C_{12}$.

When the switches $SW_{11}$ and $SW_{12}$ are turned off, signals across the respective switches may be considered as offset signals because the signals are constant. Furthermore, since the NMOS transistors $NM_{11}$ and $NM_{12}$ have a differential structure, the signals may be offset by each other and ideally considered as "0." In an actual circuit, however, since the signals are not "0," switching noise may occur to reduce the resolution of an image. Therefore, the reduction in resolution of the image may be minimized through a digital double sampling (DDS) operation that offsets the switching noise through a difference between a code value after the reset voltage is sampled and a code value after the signal voltage is sampled.

When the switches $SW_{11}$ and $SW_{12}$ are turned off and a signal voltage from a pixel is AC-coupled through the capacitor $C_{12}$ and applied to the gate terminal of the NMOS transistor $NM_{12}$ as described above, a voltage level of 'reset voltage−signal voltage' may be sampled in the gate terminal of the NMOS transistor $NM_{12}$.

Then, the ramp signal $V_{Ramp}$ may be AC-coupled through the capacitor $C_{11}$ and applied to the gate terminal of the NMOS transistor $NM_{11}$. As the voltage level of the ramp signal falls or rises, the gate voltage values of the NMOS transistors $NM_{11}$ and $NM_{12}$ may coincide with each other at a certain point.

When the gate voltage of the NMOS transistor $NM_{11}$ to which the ramp signal is applied crosses the gate voltage of the NMOS transistor $NM_{12}$ to which the CDS value (reset voltage−signal voltage) of the pixel signal is applied, the output voltage value of the first output node $V_{outp}$ may fall or rise by a voltage difference between NMOS transistors $NM_{11}$ and $NM_{12}$×gain.

At this time, a kick-back effect may occur to reduce the resolution of an image. The kick-back error may occur when the magnitude of the change of the output voltage affects a parasitic capacitor which is formed in the gate terminal of the NMOS transistor $NM_{12}$.

Therefore, when the comparator is implemented as illustrated in FIG. 2B, it is possible to minimize the influence of the change of the output voltage on the parasitic capacitor which is formed in the gate terminal of the NMOS transistor $NM_{12}$.

As illustrated in FIG. 2B, the comparator in accordance with another example may further include an NMOS transistor $NM_{13}$ and an NMOS transistor $NM_{14}$, in addition to the components of the comparator of FIG. 2A. The NMOS transistor $NM_{13}$ may have a drain terminal coupled to the second output node $V_{outn}$, a gate terminal coupled to the first supply voltage $V_{DD}$, and a source terminal coupled to the drain terminal of the NMOS transistor $NM_{11}$, and the NMOS transistor $NM_{14}$ may have a drain terminal coupled to the first output node $V_{outp}$, a gate terminal coupled to the first supply voltage $V_{DD}$, and a source terminal coupled to the drain terminal of the NMOS transistor $NM_{12}$.

As such, the comparator in accordance with the example illustrated in FIG. 2B may further include the NMOS transistors $NM_{13}$ and $NM_{14}$ to minimize an occurrence of kick-back error (kick-back noise).

Even after the gate voltage of the NMOS transistor $NM_{11}$ crosses the gate voltage of the NMOS transistor $NM_{12}$, the ramp signal may fall or rise to a preset lower bound or upper bound of the voltage level while falling or rising one step by one step. Thus, the gate voltage of the NMOS transistor $NM_{11}$ may continuously fall or rise. Therefore, the output voltage value of the first output node $V_{outp}$ may fall or rise by the voltage difference between NMOS transistors $NM_{11}$ and $NM_{12}$×gain, and the operation region of the NMOS transistor $NM_{12}$ may momentarily change to the triode region or the linear region from the saturation region.

Therefore, the common voltage Vcm of the NMOS transistors $NM_{11}$ and $NM_{12}$ may significantly change, and the gate-source parasitic capacitor Cgs of the NMOS transistors $NM_{11}$ and $NM_{12}$ may significantly change.

In a period where the ramp signal rises or falls, the output value of the first output node $V_{outp}$ may significantly change. In the period where the output value of the first output node $V_{outp}$ significantly changes, the PMOS transistors $PM_{12}$ and the NMOS transistor $NM_{12}$ may be turned off with their operating points shifted. Thus, the entire operating point of the comparator may be considerably shifted.

However, since the position of the period where the output value of the first output node $V_{outp}$ significantly changes is different at each of the columns, the timings at which the operating points of the comparators at the respective columns are significantly shifted may be different from each other. Thus, due to coupling capacitance between lines of the ramp signal inputted in common or neighboring columns, cross-talk may occur between the respective columns, thereby causing banding noise.

When the change of the common voltage affects the ramp signal through the capacitor $C_{11}$ or the load of the ramp signal generator is changed depending on the operation status of each of the comparators, the analog-to-digital conversion processes of the neighboring comparators may be momentarily affected to cause banding noise. The banding noise may reduce the resolution of an image.

Such a banding noise may be suppressed by including buffers at the input nodes of the comparators.

Figure 3:
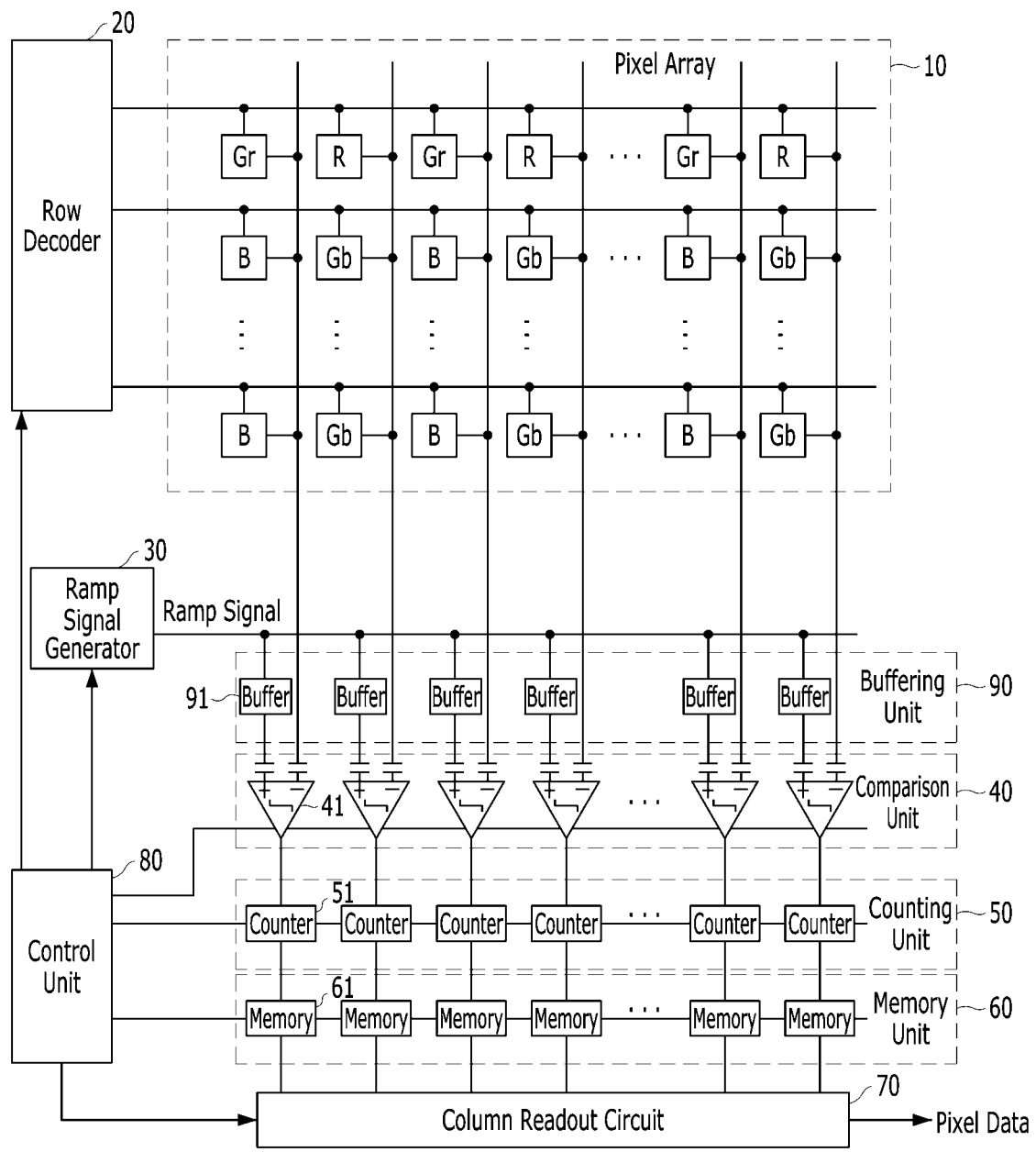
FIG. 3 illustrates another example of the CIS.

As illustrated in FIG. 3, the CIS implemented based on some embodiments of the disclosed technology may include a buffering circuit 90 in addition to the components of the CIS of FIG. 1A. The buffering circuit 90 may buffer the ramp signal applied from the ramp signal generator 30, and output the buffered signal to the comparison circuit 40.

The buffering circuit 90 may include a plurality of buffers. That is, the buffers may be provided at the respective columns.

A first buffer 91 may receive the ramp signal applied from the ramp signal generator 30, buffer the received signal, and output the buffered signal to the comparator 41.

For an isolation structure that is implemented to avoid the banding noise, the buffers 91 may be additionally provided between the output terminal of the ramp signal generator 30 and the input terminals of the respective comparators 41, and the ramp signal may be inputted to the respective comparators 41 through the buffers 91, which makes it possible to reduce an occurrence of banding noise.

However, when the buffers are added to reduce banding noise, a required area and power may be increased by use of buffers, and an input voltage swing may be reduced by gain errors of the buffers.

In an embodiment of the disclosed technology, an output voltage swing control block may be used to limit an output voltage swing of the comparator, reducing an occurrence of banding noise and preventing an influence of banding noise on the performance of CDS. Furthermore, since buffers are not used, the area and power can be reduced, and the reduction of the input voltage swing by the gain errors of the buffers can be prevented. Some example embodiments of the disclosed technology will be described in detail with reference to FIGS. 4 to 8.

Figure 4:
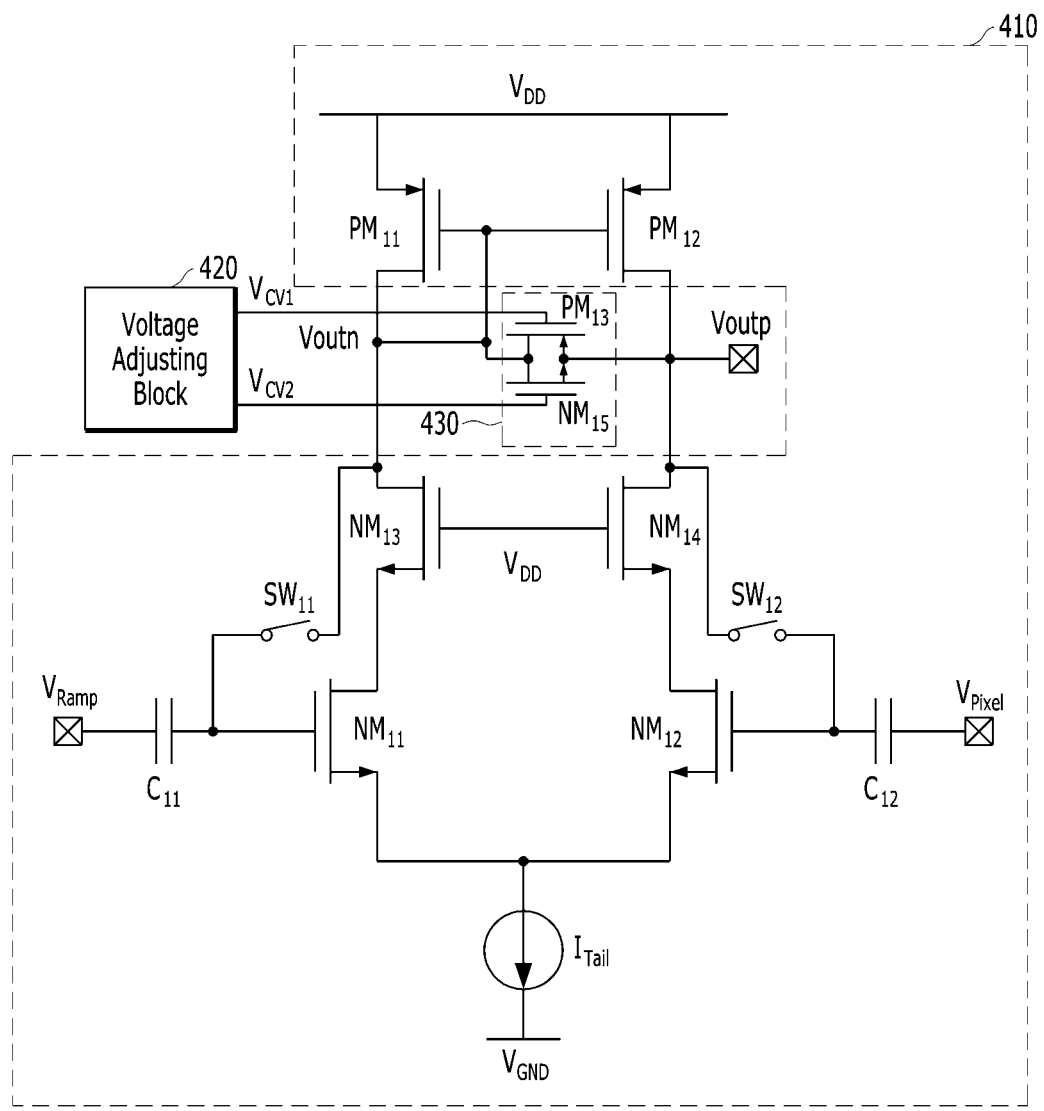
FIG. 4 is a diagram illustrating an example of a comparator implemented based on an embodiment of the disclosed technology.
Figure 5:
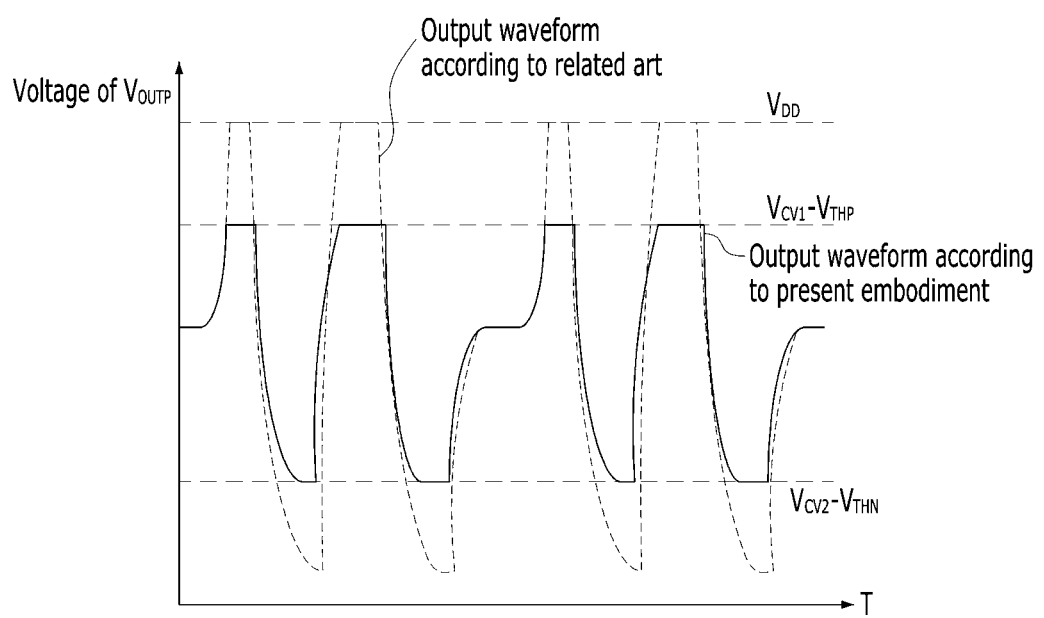
FIG. 5 illustrates a waveform of output voltages of the comparator implemented based on an embodiment of the disclosed technology.

FIG. 4 is a diagram illustrating an example of a comparator implemented based on an embodiment of the disclosed technology, and FIG. 5 illustrates a waveform of output voltages of the comparator implemented based on an embodiment of the disclosed technology.

As illustrated in FIG. 4, the comparator may include a comparison block 410, a voltage adjusting block 420 and an output voltage swing control block 430. The comparison block 410 may compare a ramp signal with a pixel signal and output a comparison signal. The voltage adjusting block 420 may adjust a clamping voltage. The output voltage swing control block 430 may establish upper and lower bounds of the output voltage swing of the comparison block 410 according to the clamping voltage from the voltage adjusting block 420.

As an example, the comparison block 410 may be implemented as described with reference to FIG. 2B.

The voltage adjusting block 420 may generate a first clamping voltage $V_{CV1}$ and a second clamping voltage $V_{CV2}$. The voltage adjusting block 420 may adjust the voltage levels of the first and second clamping voltages $V_{CV1}$ and $V_{CV2}$ to preset levels and apply the adjusted voltages to the output voltage swing control block 430. The voltage adjusting block 420 may include a global digital-analog converter (DAC) which adjusts the first and second clamping voltages $V_{CV1}$ and $V_{CV2}$ to the preset levels and globally applies the adjusted voltages to the output voltage swing control blocks 430 of the respective columns.

The output voltage swing control block 430 may include a clamp circuit for clamping the output voltage of the comparison block 410 according to the clamping voltage from the voltage adjusting block 420.

The output voltage swing control block 430 may include a PMOS transistor $PM_{13}$ and an NMOS transistor $NM_{15}$. The PMOS transistor $PM_{13}$ may be used to establish an upper bound of the output voltage of the comparison block 410 according to the first clamping voltage $V_{CV1}$ from the voltage adjusting block 420, and the NMOS transistor $NM_{15}$ may be used to establish a lower bound of the output voltage of the comparison block 410 according to the second clamping voltage $V_{CV2}$ from the voltage adjusting block 420.

The output voltage swing control block 430 may be coupled between the first output node $V_{outp}$ and the second output node $V_{outn}$.

That is, the output voltage swing control block 430 may include: the PMOS transistor $PM_{13}$ having a source terminal coupled to the first output node $V_{outp}$, a gate terminal coupled to the voltage adjusting block 420, and a drain terminal coupled to the second output node $V_{outn}$; and the NMOS transistor $NM_{15}$ having a source terminal coupled to the first output node $V_{outp}$, a gate terminal coupled to the voltage adjusting block 420, and a drain terminal coupled to the second output node $V_{outn}$.

The operation of the comparator implemented based on some embodiments of the disclosed technology are as follows.

In order to suppress a banding noise that might occur during a CDS operation, an operation region (e.g., saturation region) of the NMOS transistor $NM_{12}$ receiving a pixel signal through the gate terminal thereof and an operation region of the PMOS transistor $PM_{12}$ serving as a load transistor need to be secured.

In the comparator implemented based on some embodiments of the disclosed technology, the PMOS transistor $PM_{13}$ and the NMOS transistor $NM_{15}$ may be used to implement a clamp circuit to establish upper and lower bounds on the output voltage swing of the comparison block 410.

More specifically, in a period where the ramp signal for sampling a reset voltage during the CDS operation is inputted, a waveform of the output voltage of the first output node $V_{outp}$ fluctuates in a large range. Since the clamping circuit satisfies a condition of Equation 1, the PMOS transistor $PM_{13}$ of the clamping circuit may be turned on, and the upper level of the output waveform (output voltage swing) may be clamped.

$$V_{CV1} - V_{THP} < 0$$

$$V_{CV2} - V_{THN} < 0 \quad \text{[Equation 1]}$$

In Equation 1, $V_{THP}$ represents a threshold voltage of the PMOS transistor $PM_{13}$, and $V_{THN}$ represents a threshold voltage of the NMOS transistor $NM_{15}$.

FIG. 5 shows that the waveform of the output voltage of the comparison block 410 implemented based on some embodiments of the disclosed technology has upper and lower bounds at certain voltage levels at which an operation margin of the PMOS transistor $PM_{12}$ is secured.

For this operation, the global DAC may adjust the first clamping voltage $V_{CV1}$ to 2 or 3-bit level, thereby controlling the operation margin of the PMOS transistor $PM_{12}$.

In a period in which the ramp signal for sampling the signal voltage is inputted during the CDS operation, a waveform of the output value of the first output node $V_{outp}$ fluctuates in a large range. Since the clamping circuit satisfies a condition of Equation 2, the NMOS transistor $NM_{15}$ of the clamping circuit may be turned on, and the lower level of the output waveform may be clamped.

$$V_{CV1} - V_{THP} > 0$$

$$V_{CV2} - V_{THN} > 0 \quad \text{[Equation 2]}$$

FIG. 5 shows that the waveform of the output voltage of the comparison block 410 implemented based on some embodiments of the disclosed technology has upper and lower bounds at certain voltage levels at which an operation margin of the NMOS transistor $NM_{12}$ is secured.

For this operation, the global DAC may adjust the second clamping voltage $V_{CV2}$ to 2 or 3-bit level, thereby controlling the operation margin of the NMOS transistor $NM_{12}$.

In the output waveform diagram of FIG. 5, the X-axis may indicate the operation time (or timing), and the Y-axis may indicate the voltage outputted from the first output node $V_{outp}$ of the comparison block 410.

FIG. 5 shows that the output voltage of comparators that is implemented without the output voltage swing control block 430 approaches the first supply voltage $V_{DD}$, but the upper level of the output waveform is clamped according to a set value of the first clamping voltage $V_{CV1}$, and the lower level of the output waveform is also clamped according to a set value of the second clamping voltage $V_{CV2}$.

In some embodiments of the disclosed technology, the operation regions of the NMOS transistor $NM_{12}$ and the PMOS transistor $PM_{12}$ can be maintained to thereby reduce banding noise. Furthermore, the influence of the change in output voltage value of the output node on the parasitic capacitor formed in the gate terminal of the NMOS transistor $NM_{12}$ can be minimized to reduce an occurrence of kick-back error (kick-back noise), and the issue of the area or power increased by the structure for applying the ramp signal through the buffer according to the related art can be minimized.

Figure 6:
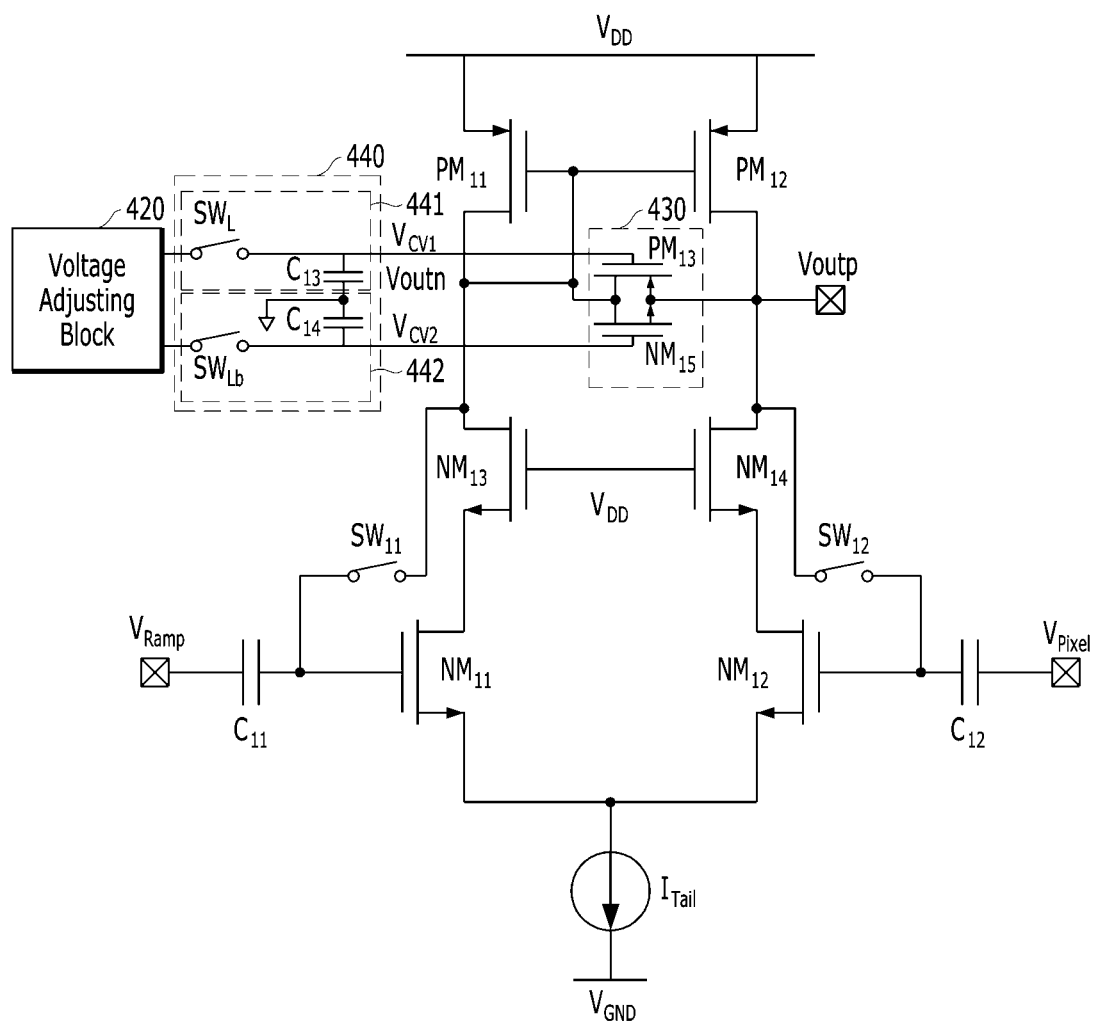
FIG. 6 is a diagram illustrating an example of a comparator implemented based on another embodiment of the disclosed technology.
Figure 7:
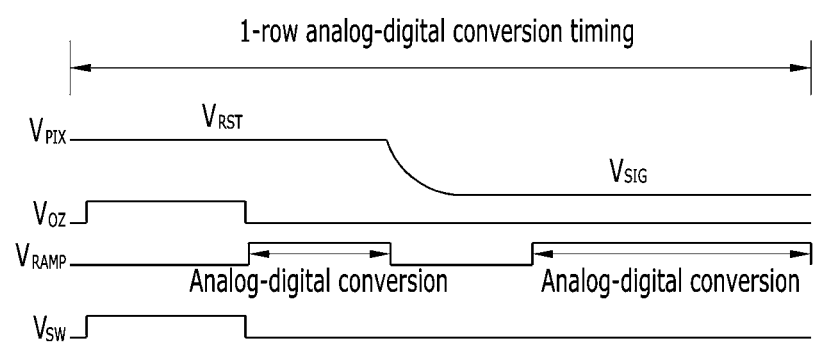
FIG. 7 is an operation timing diagram of the comparator implemented based on some embodiments of the disclosed technology.

FIG. 6 is a diagram of an example of a comparator implemented based on another embodiment of the disclosed technology, and FIG. 7 is an operation timing diagram of the comparator implemented based on some embodiments of the disclosed technology.

When the comparator is implemented as illustrated in FIG. 4, the first and second clamping voltages $V_{CV1}$ and $V_{CV2}$ of the voltage adjusting block 420 may be applied to the comparison blocks 410 of the respective columns in common, and thus the banding noise might still occur.

Therefore, in some embodiments of the disclosed technology, the comparator may further include a sampling block 440 for sampling the clamping voltage from the voltage adjusting block 420 and transferring the sampled voltage to the output voltage swing control block 430.

The sampling block 440 may include a first sampling circuit 441 and a second sampling circuit 442. The first sampling circuit 441 may sample the first clamping voltage $V_{CV1}$ from the voltage adjusting block 420 and apply the sampled voltage to the gate terminal of the PMOS transistor $PM_{13}$ of the output voltage swing control block 430, and the second sampling circuit 442 may sample the second clamping voltage $V_{CV2}$ from the voltage adjusting block 420 and apply the sampled voltage to the gate terminal of the NMOS transistor $NM_{15}$ of the output voltage swing control block 430.

The sampling block 440 may be provided at each of the columns, thereby making it possible to remove signal lines through which the first and second clamping voltages $V_{CV1}$ and $V_{CV2}$ are inputted to the comparison blocks 410 of the respective columns in common. The sampling circuits 441 and 442 may include MOS capacitors $C_{13}$ and $C_{14}$ and MOS switches $SW_L$ and $SW_{Lb}$, respectively.

As illustrated in FIG. 7, the comparator may be implemented in such a manner that the sampling block 440 performs the sampling operation at timing $V_{SW}$ having the same timing as timing $V_{OZ}$ corresponding to an auto-zeroing operation period of the comparison block 410, or performs the sampling operation at arbitrary timing before the CDS operation.

Here, $V_{SW}$ represents a signal for controlling on/off of the MOS switches in order to sample the first and second clamping voltages $V_{CV1}$ and $V_{CV2}$, and the signal $V_{SW}$ may be applied from an external control circuit (for example, a timing generator).

Figure 8:
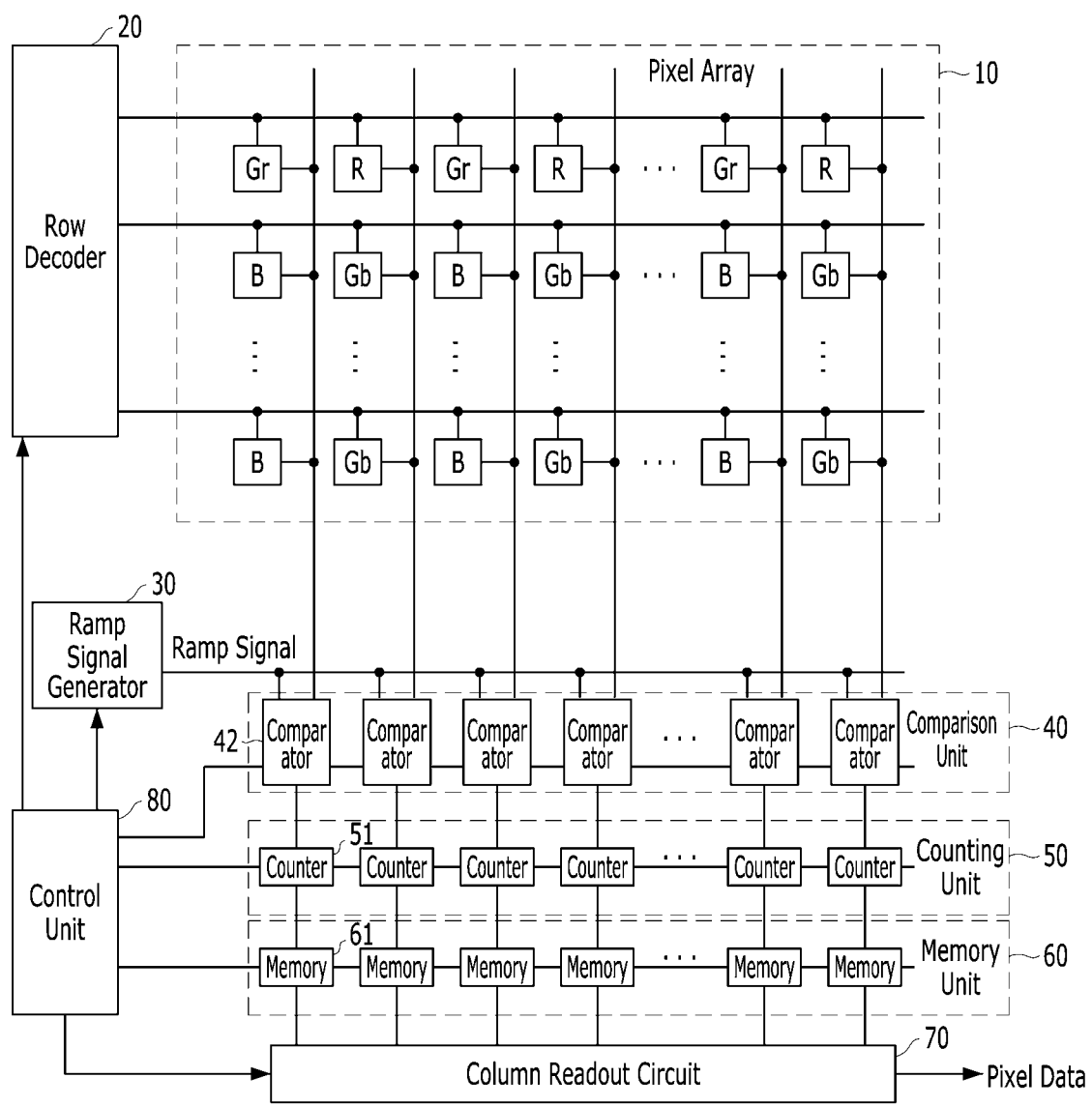
FIG. 8 is a diagram illustrating a CIS implemented based on an embodiment of the disclosed technology.

FIG. 8 is a diagram illustrating a CIS implemented based on an embodiment of the disclosed technology.

As illustrated in FIG. 8, the CIS implemented based on some embodiments of the disclosed technology may include a pixel array 10, a row decoder 20, a ramp signal generator 30, a comparison circuit 40, a counting circuit 50, a memory circuit 60, a control circuit 80 and a column readout circuit 70. The pixel array 10 may output pixel signals corresponding to incident light. The row decoder 20 may select a pixel in the pixel array 10 at each row line and control an operation of the selected pixel, under control of the control circuit 80. The ramp signal generator 30 may generate a ramp signal under control of the control circuit 80. The comparison circuit 40 may compare the value of the ramp signal applied from the ramp signal generator 30 to the values of the pixel signals outputted from the pixel array 10 under control of the control circuit 80. The counting circuit 50 may count clock pulses applied from the control circuit 80 according to each of output signals of the comparison circuit 40. The memory circuit 60 may store the counting information from the counting circuit 50 under control of the control circuit 80. The control circuit 80 may control the operations of the row decoder 20, the ramp signal generator 30, the comparison circuit 40, the counting circuit 50, the memory circuit 60 and the column readout circuit 70. The column readout circuit 70 may sequentially output the data of the memory circuit 60 as pixel data PXDATA under control of the control circuit 80. The comparison circuit 40 may include a comparator 42 implemented based on some embodiments of the disclosed technology for each column.

In some embodiments of the disclosed technology, a comparator includes an output node coupled to one or more pull up transistors configured to receive a positive supply voltage and one or more pull down transistors configured to receive a negative supply voltage, a clamp control circuit (e.g., voltage adjusting block 420) configured to generate a first control voltage (e.g., first clamping voltage $V_{CV1}$) when a voltage of the output node rises above a first threshold level and generate a second control voltage (e.g., second clamping voltage $V_{CV2}$) when the voltage of the output node drops below a second threshold level, wherein the first voltage is lower than the positive supply voltage and the second voltage is higher than the negative supply voltage, and a clamp circuit coupled to the output node to clamp a voltage value of the output node to a voltage range between the first threshold voltage and the second threshold voltage based on the first and second control voltages.

The clamp circuit includes one or more transistors to provide a current path to the output node to adjust a voltage at the output node based on a current that flows through the current path. As an example, the one or more transistors includes a PMOS transistor (e.g., $PM_{13}$) and an NMOS transistor (e.g., $NM_{15}$) coupled in parallel to the output node, gate terminals of the PMOS and NMOS transistors being coupled to the clamp control circuit.

In some implementations, the comparator may further include a local sample and hold circuit (e.g., sampling block 440) coupled between the clamp control circuit and the clamp circuit to hold the first and second control voltages to be applied to the clamp circuit. The local sample and hold circuit includes first and second capacitors configured to hold the first and second control voltages, respectively.

In some embodiments of the disclosed technology, a comparator includes at least two input nodes (e.g., $V_{Ramp}$, $V_{Pixel}$), at least one output node (e.g., $V_{outp}$), one or more pull up transistors (e.g., $PM_{12}$) coupled to the at least one output node configured to receive a positive supply voltage (e.g., $V_{DD}$) to increase an output node of the comparator towards the positive supply voltage, one or more pull down transistors (e.g., $NM_{14}$) coupled to the at least one output node configured to receive a negative supply voltage (e.g., $V_{GND}$) to decrease the output node of the comparator towards the negative supply voltage, a clamp control circuit (e.g., voltage adjusting block 420) configured to generate a first control voltage (e.g., first clamping voltage $V_{CV1}$) when a voltage of the output node rises above a first threshold level and generate a second control voltage (e.g., second clamping voltage $V_{CV2}$) when the voltage of the output node drops below a second threshold level, a first clamp circuit (e.g., $PM_{13}$) including a first control terminal to receive the first control voltage, the first clamp circuit coupled to the output node to provide a first current path to the output node based on the first control voltage to clamp a voltage value of the output node, and a second clamp circuit (e.g., $NM_{15}$) including a second control terminal to receive the second control voltage, the second clamp circuit coupled to the output node to provide a second current path to the output node based on the second control voltage to clamp the voltage value of the output node.

The first clamp circuit may include a PMOS transistor coupled to the output node and including a gate terminal coupled to the clamp control circuit to receive the first control voltage. The second clamp circuit may include an NMOS transistor coupled to the output node and including a gate terminal coupled to the clamp control circuit to receive the second control voltage.

In some implementations, the comparator may further include a local sample and hold circuit coupled between the clamp control circuit and the first and second clamp circuits to hold the first and second control voltages to be applied to the clamp circuit. The local sample and hold circuit includes first and second capacitors (e.g., 441, 442) configured to hold the first and second control voltages, respectively.

In some embodiments of the disclosed technology, an image sensor includes a pixel array including a plurality of imaging pixels arranged rows and columns to generate pixel signals responsive to incident light, a ramp signal generator to generate a ramp signal, and a comparator coupled to the pixel array and the ramp signal to compare the pixel signals with the ramp signal. The comparator includes an output node coupled to one or more pull up transistors configured to receive a positive supply voltage and one or more pull down transistors configured to receive a negative supply voltage, a clamp control circuit configured to generate a first control voltage when a voltage of the output node rises above a first threshold level and generate a second control voltage when the voltage of the output node drops below a second threshold level, wherein the first voltage is lower than the positive supply voltage and the second voltage is higher than the negative supply voltage, and a clamp circuit coupled to the output node to clamp a voltage value of the output node to a voltage range between the first threshold voltage and the second threshold voltage based on the first and second control voltages.

The clamp circuit includes one or more transistors to provide a current path to the output node to adjust a voltage at the output node based on a current that flows through the current path. The one or more transistors may include a first clamp circuit including a first control terminal to receive the first control voltage, the first clamp circuit coupled to the output node to provide a first current path to the output node based on the first control voltage to clamp a voltage value of the output node. For example, the first clamp circuit includes a PMOS transistor coupled to the output node and including a gate terminal coupled to the clamp control circuit to receive the first control voltage.

The one or more transistors may also include a second clamp circuit including a second control terminal to receive the second control voltage and coupled to the output node to provide a second current path to the output node based on the second control voltage to clamp the voltage value of the output node. The second clamp circuit includes an NMOS transistor coupled to the output node and including a gate terminal coupled to the clamp control circuit to receive the second control voltage.

The clamp circuit may also include a local sample and hold circuit coupled between the clamp control circuit and the clamp circuit to hold the first and second control voltages to be applied to the clamp circuit. The local sample and hold circuit includes first and second capacitors configured to hold the first and second control voltages, respectively.

In some embodiments of the disclosed technology, the comparator may limit an output voltage swing thereof using the output voltage swing control block, thereby reducing an occurrence of banding noise and preventing an influence of banding noise on the performance of the CDS operation.

Furthermore, since no buffers are used, it is possible to reduce the required area and power while solving the problem that the input voltage swing is reduced by a gain error of a buffer.

Although various embodiments have been described for illustrative purposes, it will be apparent to those skilled in the art that various changes and modifications may be made without departing from the spirit and scope of the invention as defined in the following claims.

What is claimed is:

1. A comparator comprising:
a comparison circuit configured to compare a ramp signal with a pixel signal and output a comparison signal;
a voltage adjusting circuit configured to adjust a clamping voltage;
an output voltage swing control circuit coupled to the comparison circuit and the voltage adjusting circuit to control an output voltage swing of the comparison circuit based on the adjusted clamping voltage output from the voltage adjusting circuit; and
a sampling circuit coupled to the voltage adjusting circuit to sample the adjusted clamping voltage from the voltage adjusting circuit, and transfer the sampled voltage to the output voltage swing control circuit.

2. The comparator of claim 1, wherein the sampling circuit comprises:
a first sampling circuit coupled to the voltage adjusting circuit to sample a first clamping voltage from the voltage adjusting circuit and apply the sampled voltage to the output voltage swing control circuit; and
a second sampling circuit coupled to the voltage adjusting circuit to sample a second clamping voltage from the voltage adjusting circuit and apply the sampled voltage to the output voltage swing control circuit.

3. The comparator of claim 2, wherein the voltage adjusting circuit is configured to adjust each of the first clamping voltage and the second clamping voltage to a preset level.

4. The comparator of claim 2, wherein the voltage adjusting circuit comprises a global digital-analog converter (DAC) suitable for adjusting each of the first clamping voltage and the second clamping voltage to a preset level and globally applying the adjusted voltage to the output voltage swing control circuit of each column.

5. The comparator of claim 2, wherein the output voltage swing control circuit comprises:
a first transistor suitable for limiting an upper level of the output voltage of the comparison circuit according to the first clamping voltage from the voltage adjusting circuit; and
a second transistor suitable for limiting a lower level of the output voltage of the comparison circuit according to the second clamping voltage from the voltage adjusting circuit.

6. The comparator of claim 1, wherein the sampling circuit is provided at each column.

7. The comparator of claim 1, wherein the output voltage swing control circuit comprises a clamping circuit suitable for clamping an output voltage of the comparison circuit according to the clamping voltage from the voltage adjusting circuit.

8. A comparator comprising:
a comparison circuit configured to compare a ramp signal with a pixel signal and output a comparison signal;
a voltage adjusting circuit configured to adjust a clamping voltage; and
an output voltage swing control circuit coupled to the comparison circuit and the voltage adjusting circuit to control an output voltage swing of the comparison circuit based on the adjusted clamping voltage output from the voltage adjusting circuit, wherein the output voltage swing control circuit is provided between a first output node and a second output node.

9. The comparator of claim 8, wherein the output voltage swing control circuit comprises:
a PMOS transistor having a source terminal coupled to the first output node, a gate terminal coupled to the voltage adjusting circuit, and a drain terminal coupled to the second output node; and
an NMOS transistor having a source terminal coupled to the first output node, a gate terminal coupled to the voltage adjusting circuit, and a drain terminal coupled to the second output node.

10. A comparator, comprising:
an output node coupled to one or more pull up transistors configured to pass a positive supply voltage to an output terminal thereof and one or more pull down transistors configured to pass a negative supply voltage to the output terminal thereof;
a clamp control circuit configured to generate a first control voltage upon a detection that a voltage of the output node rises above a first threshold level and generate a second control voltage upon a detection that the voltage of the output node drops below a second threshold level, wherein the first control voltage is lower than the positive supply voltage and the second control voltage is higher than the negative supply voltage; and
a clamp circuit coupled to the output node to maintain a voltage value of the output node within a voltage range between the first threshold voltage and the second threshold voltage based on the first and second control voltages output from the clamp control circuit, wherein the clamp circuit includes one or more transistors to provide a current path to the output node to adjust a voltage at the output node based on a current that flows through the current path.

11. The comparator of claim 10, wherein the one or more transistors include a PMOS transistor and an NMOS transistor coupled in parallel to the output node, gate terminals of the PMOS and NMOS transistors being coupled to the clamp control circuit.

12. The comparator of claim 10, further comprising:
a local sample and hold circuit coupled between the clamp control circuit and the clamp circuit to hold the first and second control voltages to be applied to the clamp circuit.

13. The comparator of claim 12, wherein the local sample and hold circuit includes first and second capacitors configured to hold the first and second control voltages, respectively.

14. A comparator, comprising:
at least two input nodes;
at least one output node;
one or more pull up transistors coupled to the at least one output node configured to receive a positive supply voltage to increase the at least one output node of the comparator towards the positive supply voltage;
one or more pull down transistors coupled to the at least one output node configured to receive a negative supply voltage to decrease the at least one output node of the comparator towards the negative supply voltage;
a clamp control circuit to generate a first control voltage upon a detection that a voltage of the at least one output node rises above a first threshold level and generate a second control voltage upon a detection that the voltage of the at least one output node drops below a second threshold level;

a first clamp circuit including a first control terminal to receive the first control voltage output from the clamp control circuit and coupled to the at least one output node to provide a first current path to the at least one output node based on the first control voltage to clamp a voltage value of the at least one output node; and a second clamp circuit including a second control terminal to receive the second control voltage output from the clamp control circuit and coupled to the at least one output node to provide a second current path to the at least one output node based on the second control voltage to clamp the voltage value of the at least one output node.

15. The comparator of claim 14, wherein the first clamp circuit includes a PMOS transistor coupled to the at least one output node and including a gate terminal coupled to the clamp control circuit to receive the first control voltage.

16. The comparator of claim 14, wherein the second clamp circuit includes an NMOS transistor coupled to the output node and including a gate terminal coupled to the clamp control circuit to receive the second control voltage.

17. The comparator of claim 14, further comprising:
a local sample and hold circuit coupled between the clamp control circuit and the first and second clamp circuits to hold the first and second control voltages to be applied to the clamp circuit.

18. The comparator of claim 17, wherein the local sample and hold circuit includes first and second capacitors configured to hold the first and second control voltages, respectively.

* * * * *